(12) United States Patent
Chang

(10) Patent No.: US 7,252,911 B2
(45) Date of Patent: Aug. 7, 2007

(54) ESD-RESISTANT PHOTOMASK AND METHOD OF PREVENTING MASK ESD DAMAGE

(75) Inventor: Ching-Yu Chang, I-Lan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 481 days.

(21) Appl. No.: 10/810,920

(22) Filed: Mar. 26, 2004

(65) Prior Publication Data

US 2005/0214654 A1 Sep. 29, 2005

(51) Int. Cl.
*G03F 1/00* (2006.01)

(52) U.S. Cl. .......................................... 430/5
(58) Field of Classification Search ............ 430/5, 430/30, 311; 250/492.21; 428/14
See application file for complete search history.

(56) References Cited

U.S. PATENT DOCUMENTS

| 5,585,299 A | * | 12/1996 | Hsu ........................... 438/275 |
| 6,984,475 B1 | * | 1/2006 | Levinson et al. ............. 430/5 |
| 2005/0051848 A1 | * | 3/2005 | Ker et al. ................... 257/356 |

* cited by examiner

*Primary Examiner*—S. Rosasco
(74) *Attorney, Agent, or Firm*—Tung & Associates

(57) ABSTRACT

An ESD-resistant photomask and method of preventing mask ESD damage is disclosed. The ESD-resistant photomask includes a mask substrate, a pattern-forming material provided on the substrate, a circuit pattern defined by exposure regions etched in the pattern-forming material, and positive or negative ions implanted into the mask substrate throughout ion implantation regions. The ions in the ion implantation regions dissipate electrostatic charges on the mask, thus preventing the buildup of electrostatic charges which could otherwise attract image-distorting particles to the mask or damage the mask.

20 Claims, 3 Drawing Sheets

ESD-RESISTANT PHOTOMASK AND METHOD OF PREVENTING MASK ESD DAMAGE

FIELD OF THE INVENTION

The present invention relates to photomasks used to transfer a circuit pattern onto a semiconductor wafer in the fabrication of integrated circuits. More particularly, the present invention relates to an electrostatic discharge (ESD) resistant photomask and method of preventing electrostatic discharge (ESD) damage to a photomask by implanting ions into the mask substrate to dissipate electrostatic charges on the mask.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Photoresist materials are coated onto the surface of a wafer by dispensing a photoresist fluid typically on the center of the wafer as the wafer rotates at high speeds within a stationary bowl or coater cup. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

During the photolithography step of semiconductor production, light energy is applied through a reticle mask onto the photoresist material previously deposited on the wafer to define circuit patterns which will be etched in a subsequent processing step to define the circuits on the wafer. Because these circuit patterns on the photoresist represent a two-dimensional configuration of the circuit to be fabricated on the wafer, minimization of particle generation and uniform application of the photoresist material to the wafer are very important. By minimizing or eliminating particle generation during photoresist application, the resolution of the circuit patterns, as well as circuit pattern density, is increased.

A reticle is a transparent plate patterned with a circuit image to be formed in the photoresist coating on the wafer. A reticle contains the circuit pattern image for only a few of the die on a wafer, such as four die, for example, and thus, must be stepped and repeated across the entire surface of the wafer. In contrast, a photomask, or mask, includes the circuit pattern image for all of the die on a wafer and requires only one exposure to transfer the circuit pattern image for all of the dies to the wafer. Reticles are used for step-and-repeat steppers and step-and-scan systems found in wafer fabrication.

Reticles must remain meticulously clean for the creation of perfect images during its many exposures to pattern a circuit configuration on a substrate. The reticle may be easily damaged such as by dropping of the reticle, the formation of scratches on the reticle surface, electrostatic discharge (ESD), and particles. ESD can cause discharge of a small current through the chromium lines on the surface of the reticle, melting a circuit line and destroying the circuit pattern. The terms "mask" and "reticle" shall be used interchangeably herein.

Reticles are transferred among various stations in a semiconductor fabrication facility in reticle pods, such as SMIF (standard mechanical interface) pods. SMIF pods are generally characterized by a pod door which mates with a pod shell to provide a sealed environment in which the reticles may be stored and transferred. In order to transfer reticles between a SMIF pod and a process tool in a fab, the pod is typically loaded either manually or automatically on a load port on the process tool. Once the pod is positioned on the load port, mechanisms in the port door unlatch the pod door from the pod shell such that the reticle may be transferred from within the pod into the process tool. Another mode of reticle transfer includes the use of a wheeled cart or vehicle which includes a frame and multiple shelves on which are supported the reticles.

Within a cleanroom environment, reticles are typically hand-carried from a stocker to a step-and-scan system which is used to transfer the circuit pattern image of the reticle to the wafer substrate. Typically, the step-and-scan system can only hold two reticles at a time, whereas a succession of multiple reticles may be used in the step-and-scan operations throughout a single day. Thus, many of the reticles must be placed on a reticle vehicle or other support to await the step-and-scan procedure.

Throughout the course of using, transferring or storing a reticle or photo mask, static electricity has a tendency to accumulate and form an electric field on the mask. The electric field attracts electrically-charged particles in the air to the mask or induces a neutralizing discharge reaction on the surface of the mask, burning or melting the mask pattern. Consequently, the circuit pattern image transferred through the mask can be distorted, compromising pattern reliability and causing severe yield loss.

To minimize damage to the reticles by electrostatic discharge (ESD) as the reticles are hand-carried or transported from the reticle stocker to the step-and-scan system, multiple ESD eliminators are provided in the cleanroom, typically beneath the cleanroom ceiling. As is well known, such ESD eleminators (also known as static eliminators or electrostatic eliminators) typically include a pair of discharge electrodes across which a high-voltage A.C. current is applied to generate ions of each polarity. Air is blown downwardly into the cleanroom environment through vents in the ceiling, and this air carries the ions generated by the ESD eliminators to the surfaces of the reticles and prevents the buildup of electrostatic charges which may otherwise discharge and damage the reticles.

One of the problems inherent in the conventional use of multiple ESD eliminators mounted beneath the ceiling of the cleanroom is that many areas in the cleanroom lack sufficient downflow of air to facilitate sufficient transfer of the neutralizing ions from the ESD eliminators to the surfaces of the reticles. This increases the likelihood of ESD-induced damage to the reticles as they are carried or transported from the reticle stocker to the step-and-scan system and as they await their turn for the step-and-scan procedure. Accordingly, a novel ESD-resistant photomask and method of preventing ESD-induced damage to a photomask is needed.

An object of the present invention is to provide a novel method for eliminating ESD-induced mask damage to a photomask.

Another object of the present invention is to provide a novel method which facilitates integrity in the transfer of a circuit pattern image from a photomask to a photoresist layer on a wafer by eliminating or substantially reducing damage to the photomask caused by electrostatic discharges.

Still another object of the present invention is to provide a novel method for preventing ESD-induced damage to a photomask, which method includes implanting ions into the substrate of the mask to dissipate electrostatic charges on the photomask.

Yet another object of the present invention is to provide a novel ESD-resistant photomask which includes a substrate, a pattern-forming material provided on the substrate, a circuit pattern image provided in the pattern-forming material, and ions implanted in the substrate throughout ion implantation regions to dissipate electrostatic charges.

SUMMARY OF THE INVENTION

In accordance with these and other objects and advantages, the present invention is generally directed to an ESD-resistant photomask which is used to transfer a circuit pattern onto a photoresist layer provided on a semiconductor wafer. The photomask includes a mask substrate, a pattern-forming material provided on the substrate, a circuit pattern defined by exposure regions etched in the pattern-forming material, and positive or negative ions implanted into the mask substrate throughout ion implantation regions. The ion implantation regions typically span the exposure regions in the mask. The ions in the ion implantation regions dissipate electrostatic charges on the mask, thus preventing the buildup of electrostatic charges which could otherwise attract image-distorting particles to the mask or damage the mask.

The present invention further includes a novel method for preventing or at least substantially reducing ESD-induced damage to a photomask. In one embodiment, the method includes providing a mask substrate, providing a pattern-forming material on the mask substrate, providing exposure regions which define a circuit pattern in the pattern-forming material, and providing ion implantation regions in the mask substrate. In another embodiment, the method includes providing a mask substrate, providing ion implantation regions in the mask substrate, providing a pattern-forming material on the mask substrate, and providing exposure regions which define a circuit pattern in the pattern-forming material.

BRIEF DESCRIPTION OF THE DRAWINGS

The invention will now be described, by way of example, with reference to the accompanying drawings, in which.

DETAILED DESCRIPTION OF THE INVENTION

Figure 1A:
FIG. 1A is a cross-section of a mask substrate in the fabrication of an ESD-resistant photomask according to the present invention.

The present invention contemplates an ESD-resistant photomask for transferring a circuit pattern onto a photoresist layer provided on a semiconductor wafer during the photolithography stage of integrated circuit fabrication. The ESD-resistant photomask includes a transparent mask substrate, a pattern-forming material deposited on the substrate, light-transmissive exposure regions etched in the pattern-forming material to define a circuit pattern, and positive or negative ions implanted into the substrate throughout ion implantation regions which typically span the exposure regions in the mask. Electrostatic charges on the mask are dissipated by the ions in the ion implantation regions, thus preventing the buildup of electrostatic charges which could otherwise attract image-distorting particles to the mask or damage the mask.

The method of the present invention further includes a novel method for preventing or at least substantially reducing ESD-induced damage to a photomask. The method includes providing a mask substrate, providing a pattern-forming material on the mask substrate, providing exposure regions which define a circuit pattern in the pattern-forming material, and providing ion implantation regions in the mask substrate. In another embodiment, the method includes providing a mask substrate, providing ion implantation regions in the mask substrate, providing a pattern-forming material on the mask substrate, and providing exposure regions which define a circuit pattern in the pattern-forming material.

The mask substrate is a substantially light-transmissive material. Preferably, the mask substrate is quartz, since quartz has a low thermal expansion coefficient, a high chemical stability and a high optical transmission. Alternatively, the mask substrate may be calcium fluoride ($CaF_2$) or fused silica. The pattern-forming material can be any suitable opaque film in which a circuit pattern can be etched in the form of light-transmissive exposure regions. Preferably, the pattern-forming material is chrome.

A variety of positive or negative ions may be implanted in the mask substrate throughout the ion implantation regions for the charge-dissipating function. Ions which are suitable for implantation according to the present invention include boron, arsenic, phosphorous, aluminum and gallium, for example.

The ESD-resistant mask of the present invention may be a binary intensity mask (BIM), a half-tone phase-shifting mask (HTPSM) or an altPSM (alternating phase-shifting mask). Recent improvements in photolithography have increased the density and enhanced the performance of semiconductor devices by shrinking the integrated circuits (ICs). During photolithography, light diffration tends to degrade the aerial image when the CD (critical dimension) becomes smaller than the actinic wavelength (the wavelength of light at which a mask is used in a wafer stepper to selectively expose photoresist coated on a substrate). As needed, a phase-shifting mask (PSM) may be used as a resolution enhancement technique to achieve a wider process latitude. Unlike a binary mask, which uses only chrome to control the amplitude of light transmitted through a quartz substrate, a PSM further modulates the phase of light to take advantage of destructive interference to compensate for the effects of diffraction.

Referring to FIGS. 1A-1D, an ESD-resistant photomask 10 (FIG. 1D) according to the present invention is fabricated by initially providing a mask substrate 12, which is shown in FIG. 1A. The mask substrate 12 is preferably quartz, due to the low thermal expansion coefficient, high chemical stability and high optical transmission of quartz. Alternatively, the mask substrate 12 may be calcium fluoride ($CaF_2$) or fused silica, in non-exclusive particular.

Figure 1B:
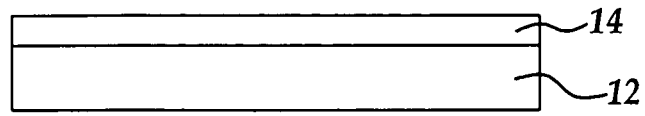
FIG. 1B is a cross-section of a mask substrate and a pattern-forming material provided on the mask substrate in the fabrication of an ESD-resistant photomask according to the present invention.

As shown in FIG. 1B, pattern-forming material 14 is next deposited on the mask substrate 12. Preferably, the pattern-forming material 14 is chromium. The pattern-forming material 14 will ultimately undergo patterning to create necessary design shapes which define the circuit pattern to be transmitted to a photoresist layer (not shown) on a wafer (not shown). The pattern-forming material 14 is preferably less than typically about 1,000 angstroms thick and is sputter-deposited on the mask substrate 12, using PVD (physical vapor deposition) techniques known by those skilled in the art. An antireflective layer of chromium oxide (not shown), which is typically about 200 angstroms thick, may be provided on the pattern-forming material 14, as is known by those skilled in the art.

Figure 1C:
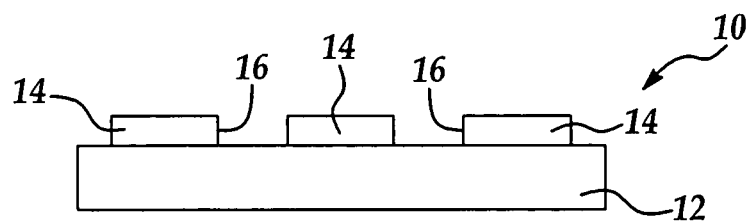
FIG. 1C is a cross-section of a mask substrate and a circuit pattern formed in a pattern-forming material provided on the mask substrate in the fabrication of an ESD-resistant photomask according to the present invention.

As shown in FIG. 1C, the pattern-forming material 14 is next etched to define multiple exposure regions 16 therein. The exposure regions 16 define the circuit pattern to be transferred from the photomask 10 to the photoresist layer (not shown) provided on the wafer (not shown). The exposure regions 16 may be formed by, for example, initially spin-coating a suitable photoresist (not shown) on the pattern-forming material 14 and soft-baking the photoresist; focusing and scanning an electron beam against the photoresist to define the circuit pattern on the photoresist; developing the exposed photoresist; and etching the exposure regions 16, which define the circuit pattern formed by the electron beam in the photoresist, into the pattern-forming material 14.

Figure 1D:
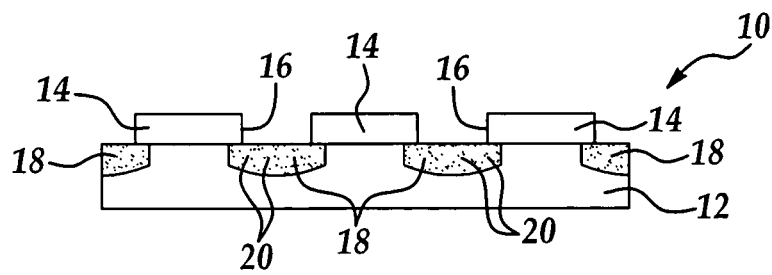
FIG. 1D is a cross-section of an ESD-resistant photomask fabricated according to the present invention.

As shown in FIG. 1D, fabrication of the ESD-resistant mask 10 is completed by forming ion implantation regions 18 in the mask substrate 12. Each ion implantation region 18 typically spans adjacent portions of the pattern-forming material 14 which remain intact after etching of the exposure regions 16. Each ion implantation region 18 has a thickness of typically less than about 500 angstroms.

Each ion implantation region 18 is formed by implanting positive or negative ions 20 into the mask substrate 12. Ions 20 which are suitable for implantation into the ion implantation regions 18 include boron, arsenic, phosphorous, aluminum and gallium, in non-exclusive particular. The ion implantation process can be carried out in a conventional ion implanter (not shown), which includes an ion source that creates the ions 20. A mass analyzer (not shown) in the ion implanter extracts and separates the ions 20 to form an ion beam. The number of ions 20 in the beam is related to the concentration of ions 20 introduced into the implantation regions 18. Preferably, the concentration of ions 20 in each ion implantation region 18 is typically about $10^{10}$ ions/cm$^2$. The ions 20 in the ion beam are accelerated in a voltage field to attain a high velocity (about $10^7$ cm/sec, and are implanted in the mask substrate 12 due to their high velocity. The ion implantation process is typically followed by a thermal anneal step to activate the ions 20 in the ion implantation regions 18.

In use of the ESD-resistant mask 10, during a photolithography exposure process, light (not shown) is transmitted through the exposure regions 16, ion implantation regions 18 and transparent mask substrate 12 and impinges on a photoresist (not shown) deposited on a wafer to transfer the circuit pattern to the photoresist, as is known by those skilled in the art. The portions of the pattern-forming material 14 which remain on the mask substrate 12 shield the photoresist on the wafer from the light transmitted through the photomask 10 in the form of the circuit pattern defined by the exposure regions 16.

Figure 1E:
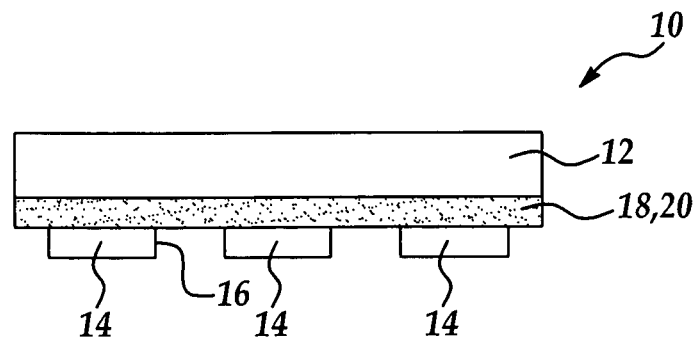
FIG. 1E is a cross-section of an ESD-resistant photomask fabricated according to the present invention, wherein fabrication of the ESD-resistant photomask is completed by forming ion implantation regions in the mask substrate.

Another embodiment of the invention is shown in FIG. 1E, wherein fabrication of the ESD resistant mask 10 is completed by forming an ion implantation region 18 in the mask substrate 12. The ion implantation region 18 is formed by implanting positive or negative ions 20 into the mask substrate 12. The implantation region has a thickness of typically less than about 500 angstroms. The pattern-forming material 14 is next deposited on the mask substrate 12 to undergo patterning to create necessary design shapes which define the circuit pattern.

Figure 2:
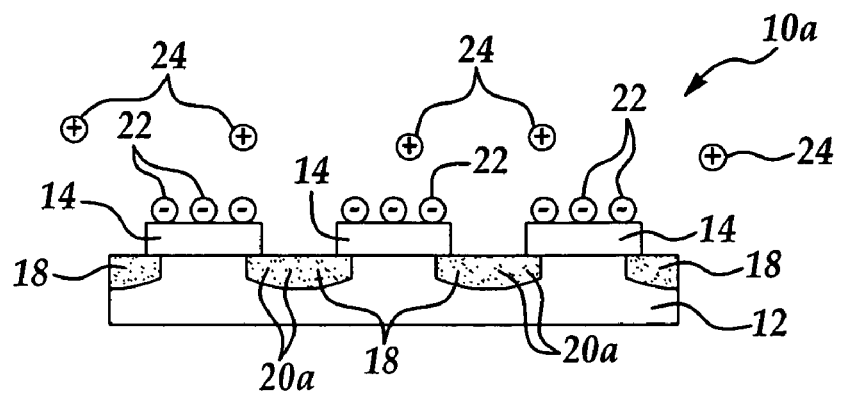
FIG. 2 is a cross-section of one embodiment of an ESD-resistant photomask of the present invention, illustrating repulsion of positive charges by positively-charged ion implantation regions in the photomask substrate to prevent electrostatic discharges on the photomask.

Referring next to FIG. 2, an embodiment of an ESD-resistant photomask 10a having positively-charged ion implantation regions 18 in the mask substrate 12 is shown. During transport, storage and/or use of the ESD-resistant photomask 10a, the positively-charged ion implantation regions 18, having positively-charged implanted ions 20a, apply a positive charge to the pattern-forming material 14. Accordingly, the positively-charged pattern-forming material 14 attracts negative charges 22 while repelling positive charges 24. This prevents electrostatic discharges from occurring between the negative charges 22 and the positive charges 24 which could otherwise damage the photomask 10.

Figure 3:
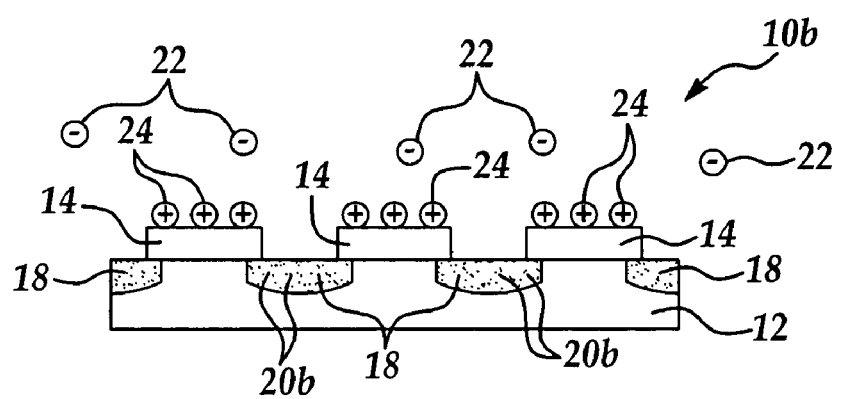
FIG. 3 is a cross-section of another embodiment of an ESD-resistant photomask of the present invention, illustrating repulsion of negative charges by negatively-charged ion implantation regions in the photomask substrate to prevent electrostatic discharges on the photomask.
Figure 3A:
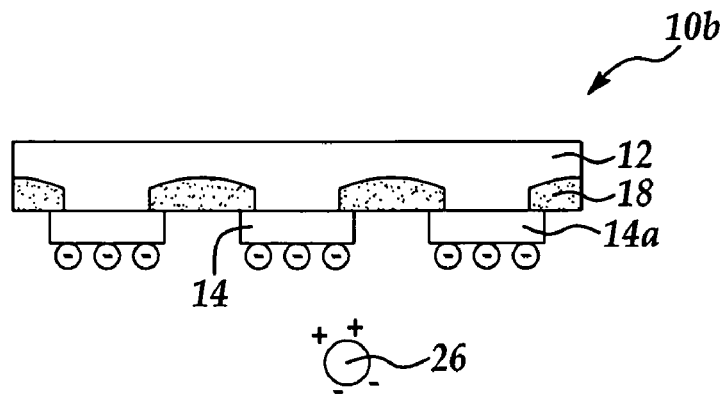
FIG. 3A is a cross-section of another embodiment of an ESD-resistant photomask of the present invention.

Referring next to FIG. 3, in another embodiment of the ESD-resistant photomask 10b, the ion implantation regions 18 are negatively-charged due to the presence of negatively-charged implanted ions 20b. Accordingly, positive charges 24 are attracted to the pattern-forming layer 14, whereas negative charges 22 are repelled by the pattern-forming layer 14. Therefore, electrostatic discharges between the negative charges 22 and the positive charges 24 on the mask 10b are prevented. Furthermore, the implanted regions 18, as referred to in FIG. 3A, are electrically-conductive and would conduct and reduce the local accumulation of electrostatic charges to the pattern-forming layer 14. Therefore, electrostatic discharges between the pattern-forming layer 14 and 14a, or between the pattern-forming layer 14 and particles 26, are prevented.

Figure 4:
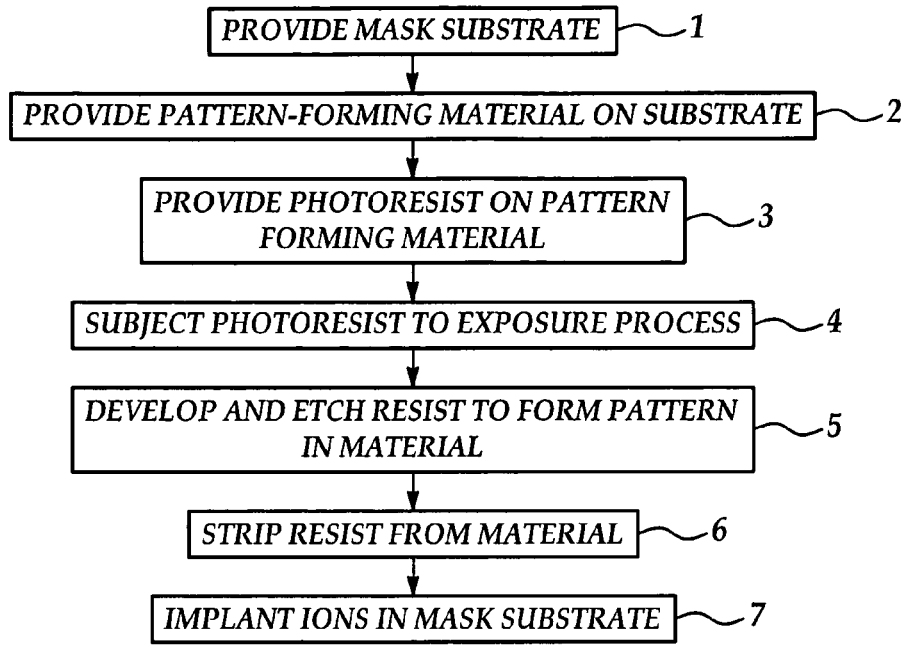
FIG. 4 is a flow diagram which summarizes sequential process steps carried out according to one embodiment of the method of the present invention.

Referring next to the flow diagram of FIG. 4, a typical method of fabricating an ESD-resistant photomask of the present invention is shown. In process step 1, a mask substrate is provided. The mask substrate may be any of a variety of suitable materials including but not limited to quartz, calcium fluoride and fused silica. In process step 2, a pattern-forming material, which may be chromium, for example, is deposited on the mask substrate. In process step 3, a photoresist material is provided on the pattern-forming material.

In process step 4 of FIG. 4, the photoresist material is subjected to an exposure process such as an electron beam exposure process. In process step 5, the resist is developed and then etched to form exposure regions which define the circuit pattern to be transferred from the photomask to a photoresist layer on a wafer. In process step 6, the photoresist is stripped from the pattern-forming material. In process step 7, positive or negative ions are implanted into the mask substrate to form ion implantation regions which repel electrical charges of opposite polarity during storage, transport and use of the ESD-resistant photomask.

Figure 5:
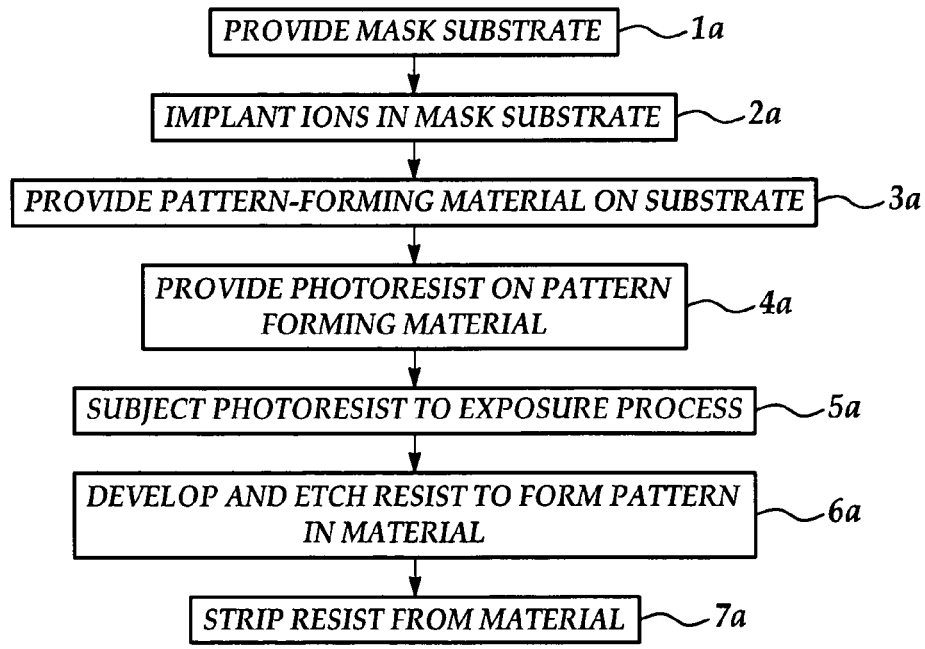
FIG. 5 is a flow diagram which summarizes sequential process step carried out according to an alternative embodiment of the method of the present invention.

Referring next to the flow diagram of FIG. 5, an alternative method of fabricating an ESD-resistant photomask of the present invention is shown. In process step 1a, a mask substrate is provided. In process step 2a, positive or negative ions are implanted into the mask substrate to form ion implantation regions. In process step 3a, a pattern-forming material is deposited on the mask substrate. In process step 4a, a photoresist material is provided on the pattern-forming material. In process step 5a, the photoresist material is subjected to an exposure process such as an electron beam exposure process. In process step 6a, the resist is developed and then etched to form exposure regions which define the circuit pattern to be transferred from the photomask to a photoresist layer on a wafer. In process step 7a, the photoresist is stripped from the pattern-forming material.

While the preferred embodiments of the invention have been described above, it will be recognized and understood that various modifications can be made in the invention and the appended claims are intended to cover all such modifications which may fall within the spirit and scope of the invention.

What is claimed is:

1. A method of preventing electrostatic discharge damage to a photomask, comprising the steps of:
    providing a mask substrate;
    providing a pattern-forming material on said mask substrate;
    providing patterned light-transmissive exposure regions in said pattern-forming material; and
    providing at least one ion implantation region in said mask substrate by implanting ions into said mask substrate, wherein said at least one ion implantation region comprises at least one of said patterned light-transmissive exposure regions.

2. The method of claim 1 wherein said mask substrate is quartz or calcium fluoride.

3. The method of claim 1 wherein said pattern-forming material is chromium.

4. The method of claim 1 wherein said at least one ion implantation region has a positive electrical charge.

5. The method of claim 1 wherein said at least one ion implantation region has a negative electrical charge.

6. The method of claim 1 wherein said ions are present in said at least one ion implantation region at a concentration of about $10^{10}$ ions/cm$^2$.

7. The method of claim 1 wherein said photomask is a binary intensity mask, a half-tone phase-shifting mask or an alternating phase-shifting mask.

8. The method of claim 1 wherein said ions are boron, arsenic, phosphorous, aluminum or gallium ions.

9. A method of preventing electrostatic discharge damage to a photomask, comprising the steps of:
    providing a mask substrate;
    providing at least one ion implantation region in said mask substrate by implanting ions into said mask substrate;
    providing a pattern-forming material on said mask substrate; and
    providing patterned light-transmissive exposure regions in said pattern-forming material wherein at least one of said patterned light-transmissive exposure regions comprises said at least one ion implantation region.

10. The method of claim 9 wherein said mask substrate is quartz or calcium fluoride.

11. The method of claim 9 wherein said pattern-forming material is chromium.

12. The method of claim 9 wherein said at least one ion implantation region has a positive electrical charge.

13. The method of claim 9 wherein said at least one ion implantation region has a negative electrical charge.

14. The method of claim 9 wherein said ions are present in said at least one ion implantation region at a concentration of about $10^{10}$ ions/cm$^2$.

15. The method of claim 9 wherein said photomask is a binary intensity mask, a half-tone phase-shifting mask or an alternating phase-shifting mask.

16. The method of claim 9 wherein said ions are boron, arsenic, phosphorous, aluminum or gallium ions.

17. An electrostatic discharge-resistant photomask comprising:
    a mask substrate;
    a pattern-forming material having light-transmissive exposure regions provided on said mask substrate; and
    at least one ion implantation region having ions implanted into said mask substrate wherein said at least one ion implantation region comprises at least one of said light-transmissive exposure regions.

18. The photomask of claim 17 wherein said at least one ion implantation region has a positive electrical charge.

19. The photomask of claim 17 wherein said at least one ion implantation region has a negative electrical charge.

20. The photomask of claim 17 wherein said ions are boron, arsenic, phosphorous, aluminum or gallium ions.

* * * * *